(12) United States Patent
Benevent

(10) Patent No.: US 11,892,489 B2  
(45) Date of Patent: Feb. 6, 2024

(54) SENSOR WITH VARIATION IN IMPEDANCE OR INDUCTANCE FOLLOWING A VARIATION OF A MEASURAND

(71) Applicants: UNIVERSITE D'AIX-MARSEILLE, Marseilles (FR); CENTRE NATIONAL DE LA RECHERCHE SCIENTIFIQUE, Paris (FR); UNIVERSITE DE TOULON, La Garde (FR)

(72) Inventor: Evangéline Benevent, Marseilles (FR)

(73) Assignees: UNIVERSITE D'AIX-MARSEILLE, Marseilles (FR); CENTRE NATIONAL DE LA RECHERCHE SCIENTIFIQUE, Paris (FR); UNIVERSITE DE TOULON, La Garde (FR)

( * ) Notice: Subject to any disclaimer, the term of this patent is extended or adjusted under 35 U.S.C. 154(b) by 0 days.

(21) Appl. No.: 17/765,426

(22) PCT Filed: Oct. 14, 2020

(86) PCT No.: PCT/EP2020/078850  
§ 371 (c)(1),  
(2) Date: Mar. 30, 2022

(87) PCT Pub. No.: WO2021/074193  
PCT Pub. Date: Apr. 22, 2021

(65) Prior Publication Data  
US 2022/0357381 A1 Nov. 10, 2022

(30) Foreign Application Priority Data  
Oct. 18, 2019 (FR) ..................... 1911713

(51) Int. Cl.  
*G01R 27/28* (2006.01)  
*G01R 27/26* (2006.01)

(52) U.S. Cl.  
CPC .................. *G01R 27/2611* (2013.01)

(58) Field of Classification Search  
CPC ...... G01R 27/2611; G01D 5/12; G01D 21/00; G01L 9/0004; G01L 9/007; G01L 1/14;  
(Continued)

(56) References Cited

U.S. PATENT DOCUMENTS 10,812,145 B1 * 10/2020 Dehmubed .......... H04B 5/0056  
10,846,494 B2 * 11/2020 Bolton ..................... H01Q 1/22  
(Continued)

FOREIGN PATENT DOCUMENTS

DE 36 38 286 A1 5/1988  
EP 2 084 521 A2 8/2009  
(Continued)

OTHER PUBLICATIONS

Mohan, et al., "Simple accurate expressions for planar spiral inductances", IEEE Journal of Solid-State Circuits, vol. 34, N°10, pp. 1419-1424, Oct. 1999.

*Primary Examiner* — Thang X Le  
(74) *Attorney, Agent, or Firm* — BakerHostetler

(57) ABSTRACT

A device for determining a measurand, includes a first pattern made from a first conductive material, the first pattern having a first impedance and having a first end and a second end spaced apart from the first end, a second pattern at least arranged between the first end and the second end of the first pattern, being in electrical contact with the first pattern. The second pattern has a second impedance that changes continuously as a function of the measurand, such that the impedance or the inductance of the assembly formed by the first and second patterns changes continuously as a  
(Continued)

function of the measurand. The device also comprises a means for determining the impedance or the inductance of the assembly, formed by the first and second patterns.

14 Claims, 6 Drawing Sheets

(58) Field of Classification Search
CPC ..... G01K 7/16; G01K 7/36; G01J 5/20; G01J 5/34; G01N 2027/222
See application file for complete search history.

(56) References Cited

U.S. PATENT DOCUMENTS

| | | |
|---|---|---|
| 2005/0284231 A1 | 12/2005 | Zimmerman et al. |
| 2008/0007384 A1 | 1/2008 | Yan et al. |
| 2010/0073135 A1* | 3/2010 | Potyrailo ........... G01N 33/0075 340/10.1 |
| 2014/0019067 A1 | 1/2014 | Potyrailo et al. |
| 2014/0028327 A1 | 1/2014 | Potyrailo et al. |
| 2016/0336759 A1* | 11/2016 | Yamamoto ............. H02J 50/60 |
| 2019/0369153 A1* | 12/2019 | Olson ................ G01R 31/2812 |
| 2020/0012008 A1* | 1/2020 | Chen ....................... G01L 9/007 |

FOREIGN PATENT DOCUMENTS

| | | |
|---|---|---|
| WO | 2008/011260 A2 | 1/2008 |
| WO | 2019/119981 A1 | 6/2019 |

* cited by examiner

SENSOR WITH VARIATION IN IMPEDANCE OR INDUCTANCE FOLLOWING A VARIATION OF A MEASURAND

CROSS-REFERENCE TO RELATED APPLICATIONS

This application is a National Stage of International patent application PCT/EP2020/078850, filed on Oct. 14, 2020, which claims priority to foreign French patent application No. FR 1911713, filed on Oct. 18, 2019, the disclosures of which are incorporated by reference in their entirety.

FIELD OF THE INVENTION

The field of the invention is that of devices for determining a measurand and relates in particular to an impedance variation sensor. In particular, the invention relates to a device for determining a measurand comprising a first pattern made of a first conductive material, a second pattern made of a second material and a means for determining the impedance between the ends of the first pattern. More specifically, the invention relates to a device for measuring the inductance which is dependent on the measurand.

BACKGROUND

In many fields of application and in particular in the field of sensors, sensitive detection and/or precise measurement of a measurand is continually sought. Some sensors are devices that are sensitive to a measurand, a physical or chemical quantity of interest, and transform this physical or chemical quantity of interest into an electrical quantity. The measurand may, for example, be the temperature, the pressure or even a gas.

Some sensors comprising a conductive strip, i.e. a strip capable of conducting electricity, are configured to respond to the discrete or continuous variation of a measurand through a dimensional change, i.e. a change in the shape of the sensor. For example, a dimensional change in the sensor may result in the displacement of one conductive element of the sensor relative to another conductive element of the sensor, the elements of the sensor being movable with respect to one another.

These sensors are, for example, configured in such a way that the dimensional change in the sensor results in a variation in the impedance of the conductive strip of the circuit. Impedance is the electrical characteristic of a circuit that defines the opposition a current encounters when* flowing through a circuit. In such sensors, measuring the impedance between each end of the conductive strip before, during and after the variation in the measurand makes it possible to detect or measure a discrete or continuous variation in the impedance. This variation in impedance is relative to the variation in the measurand and calibrating this variation in impedance thus makes it possible to obtain a sensor for the variation in a measurand.

Patent application US20080007384 discloses a variable inductor for high-frequency circuits comprising a first, fixed substrate with a fixed conductive metal strip and a conductive sheet arranged on a second, movable substrate. The second substrate is configured in such a way that it moves relative to the first substrate and allows a dimensional change in the sensor. Moving the second substrate also moves the conductive sheet so as to modify the geometry of the fixed conductive metal strip, which has the effect of modifying the value of the inductor and therefore the value of the impedance generated across the terminals of the inductor. The second, movable substrate thus makes it possible to modify the inductance generated through a change in the relative positioning in space of the second substrate with respect to the fixed conductive metal strip arranged on the first substrate.

Patent application WO2008011260 discloses an inductive sensor that responds to a parameter of interest and comprises conductive loops mechanically connected by at least one hinge. The inductive sensor is configured to respond to a parameter of interest through a dimensional change in the shape of the sensor, the conductive loops rotating about the hinges as the parameter of interest varies. More precisely, as the parameter of interest varies, the relative positions of the conductive loops will be changed by the rotation of the conductive loops about the hinges, leading to a change in the inductance of the sensor. For example, the sensor according to patent application WO200811260 comprises conductive loops arranged on a flexible substrate whose hinges are formed by folds in the flexible substrate. As the parameter of interest varies, the relative positions of the conductive loops will be changed by the rotation of the conductive loops about the hinges, for example by getting closer, entailing a change in angle between the loops and therefore a change in the inductance.

The devices of the prior art feature a variation in a parameter of the circuit, such as the impedance or the inductance, which is dependent on a dimensional change in the device or else dependent on a change in the relative positions of the various elements of the device. Such devices are sensitive to mechanical stresses which might move or deform the elements of the device and might result in a parameter of the circuit, such as the impedance or the inductance, varying without the measurand having varied. In addition, such devices require mechanical packaging that provides an environment and space sufficient for the implementation of the device and particularly for the dimensional change. Specifically, for example when the substrate is flexible, the multiplication of dimensional changes, for example folds and/or curvatures, affects the durability of such devices.

There is therefore a need for a device for measuring and/or detecting a measurand that allows robust and precise measurement of a variation in this measurand and which is suitable for long-term use.

SUMMARY OF THE INVENTION

The present invention relates to a device for determining a measurand comprising a first pattern made of a first conductive material, the first pattern having a first impedance and having a first end and a second end at a distance from the first end, a second pattern at least arranged between the first end and the second end of the first pattern, the second pattern being in electrical contact with the first pattern, being made of a second material and having a second impedance that changes continuously as a function of the measurand, such that the impedance or the inductance of the assembly formed by the first pattern and the second pattern changes continuously as a function of the measurand, and a means for determining the impedance or the inductance of the assembly formed by the first and second patterns.

What is meant by "measurand" is a quantity of interest to be measured. A measurand may be a gas concentration, a moisture content, a vapor content, a concentration of volatile organic compounds, a pressure, a temperature, etc.

What is meant by "pattern" is a layout of a conductive circuit.

The device according to the present invention makes it possible to determine a measurand or the change in a measurand. What is meant by "determine a measurand or the change in a measurand" is that the device makes it possible to determine a measurand qualitatively and/or quantitatively. What is meant by "determine a measurand qualitatively" is that the device makes it possible to determine whether a measurand is present or absent. What is meant by "metonymy" when it is, for example, indicated that the measurand is a gas, is that the device according to the present invention makes it possible to determine whether a gas is present or absent, that is to say whether the concentration of this gas is sufficient or insufficient to allow it to be detected by the device. What is meant by "determine a measurand quantitatively" is that the device makes it possible to determine a measurand, for example a gas concentration.

A first pattern may comprise a strip, bar, helix, spiral or layer and corresponds to an elongate area or volume between a first end and a second end, at a distance from the first end.

Advantageously, the device according to the invention comprises a first pattern made of a first conductive material, that is to say a first material that does not oppose or barely opposes the flow of current through a circuit. The first pattern has a first impedance, defining the opposition a current encounters when flowing through the first pattern.

The second pattern may comprise a strip, a bar, a helix, a spiral or a layer and corresponds to an elongate area or volume between at least two ends, the second pattern being at least arranged between the first end and the second end of the first pattern. Advantageously, the second pattern at least circumscribes the first pattern or is at least nested with the first pattern. What is meant by "nested" is that the second pattern is arranged so as to be, with respect to the first pattern, one inside the other, the second pattern fitting at least in the plane or the volume delimited by the first pattern. What is meant by "circumscribes" is that the second pattern is at least arranged in the plane or the volume delimited by the first pattern. Even more preferably, the second pattern is nested parallel to the first pattern, that is to say that the second pattern is arranged along the first pattern at at least a first electrical contact, at least in the plane or the volume delimited by the first pattern, and extends up to at least a second electrical contact along with the first pattern.

What is meant by "in electrical contact" is that the second pattern is intimately and electrically connected to the first pattern. What is meant by "in electrical contact" is also that the second pattern is designed so as to establish an electrical connection between at least two points of the first pattern. When the first pattern is in contact with the second pattern and the second pattern is conductive, a current flowing through the first pattern may also flow through the second pattern by virtue of to the electrical contact between the second pattern and the first pattern.

For example, in the particular case of a spiral formed of multiple turns for the first pattern, the second pattern may be arranged between the turns in such a way that it forms an electrical contact between at least one turn and the next turn, i.e. the second pattern occupies all or some of the inter-turn space. In addition, the second pattern may extend beyond the inter-turn space and cover all or some of the turns of the first pattern.

Preferably, the first conductive material comprises a material selected from copper, platinum, iron, steel, aluminum, silver, gold, zinc, lead, tin, graphite, tungsten or a combination of these materials. Even more preferably, the first conductive material comprises a material selected from copper, platinum, aluminum, silver, gold and tungsten or a combination of these materials.

Preferably, the first conductive material is insensitive to the variation in the measurand. What is meant by "insensitive to the variation in the measurand" is that the first conductive material does not oppose the current in a variable manner as a function of the change in the measurand. The variation in the impedance or the inductance of the assembly formed by the first pattern and the second pattern thus depends only on the variation in the impedance or the inductance of the second pattern which changes as a function of the measurand. This notably avoids calculations for discriminating between the variations. Even more preferably, the first conductive material is insensitive to any variation in physical quantity. The variation in the impedance or the inductance of the assembly formed by the first pattern and the second pattern does not depend on the influence of the environment on the impedance of the first pattern.

The choice of the first conductive material depends on the intended application of the device and on its operating environment. For example, in a bright environment in which the measurand is a gas, the first conductive material is preferably at least barely sensitive or insensitive to variation in the brightness and in the measurand.

The choice of the second material depends on the intended application of the device and on its environment. Such a second material is a material whose conductivity changes continuously as a function of the measurand. For example, in a bright environment in which the measurand is a gas, the second material is at least barely sensitive or insensitive to variation in the brightness but is sensitive to variation in the measurand. The sensitivity to variation in the measurand is related to the nature and/or the concentration of the measurand, in this example the gas.

The second material may comprise a selection of a material from a group of materials comprising tungsten trioxide $WO_3$, zinc oxide $ZnO$, copper oxide $CuO$, tin dioxide $SnO_2$, nickel oxide $NiO$, titanium dioxide $TiO_2$, and a combination of these elements.

Advantageously, the second material may be doped with particles such as gold, aluminum, silver, palladium or platinum particles. The doping of the second material with particles makes it possible to improve the performance of the sensor. For example, doping makes it possible to improve the sensitivity and/or the selectivity of the second material to the measurand and therefore to improve the performance of the sensor comprising the device of the invention.

The second material, whether doped or not doped, makes it possible in particular to detect gases or vapors and volatile organic compounds (VOCs) such as ozone, nitrogen oxides, ammonia, carbon monoxide, carbon dioxide, benzene, toluene, ethylbenzene, xylene, acetaldehydes, formaldehydes, isobutylene, ethanol, acetone.

Such second materials, whether doped or not doped, may be used in the device for indoor and outdoor air quality monitoring applications, for example by detecting a gas in the air. Such second materials, whether doped or not doped, may also be used for applications in the medical field. For example, such second materials, whether doped or not doped, may be used in the device in order to determine a measurand or the change in a measurand such as a gas of interest, a liquid of interest or a molecule of interest in a biological fluid such as sweat, saliva or blood, or in the breath. Another exemplary application in the medical field is determining a measurand or the change in a measurand released via sensible or insensible perspiration. Insensible perspiration corresponds to respiratory exchange via the pulmonary alveoli and via evaporation through the skin without sweating. Sensible perspiration corresponds to the evaporation of water from the surface of the skin, from the sweat that has built up there. In order to determine sensible or insensible perspiration, the device may be included in particular in a patch or a dressing. Such applications allow occasional or continuous and real-time monitoring of a measurand.

Alternatively, the second material may comprise:
- a flexible material loaded with carbon or with metal particles such as rubber, polybutadiene, polydimethylsiloxane,
- a conductive polymer, for example PEDOT:PSS or sodium poly(3,4-ethylenedioxythiophene) poly(styrene sulfonate),
- a piezoresistive semiconductor such as silicon or germanium,
- a combination of these elements.

Such second materials may be used in the device in order to determine a measurand which may be a force or a pressure for industrial applications or in the medical field.

Alternatively, the second material may comprise a selection of a material from a group of materials comprising polycrystalline or single-crystal, intrinsic (pure) or extrinsic (doped) homogeneous semiconductor materials, and a combination of these elements. Examples of such polycrystalline semiconductor materials may be: CdS, CdSe, CdTe, PbS, PbSe, PbTe. Examples of such single-crystal semiconductor materials may be: SbIn, AsIn, PIn, CdHgTe and silicon and germanium doped with Au, Cu, Sb, Zn.

Such second materials may be used in the device in order to determine a measurand, this measurand being visible light or radiation at wavelengths in the infrared or ultraviolet range for applications as optical sensors. Specifically, the second material may comprise photoconductive cells which, by virtue of the physical phenomenon of photoconduction, have a conductivity that varies as a function of visible light or of radiation in the infrared or ultraviolet range.

Alternatively, the second material may comprise a selection of a material from a group of materials comprising metals such as copper, nickel, platinum and tungsten, and polycrystalline semiconductor metal oxides such as MgO, $MgAl_2O_4$, $Mn_2O_3$, $Fe_3O_4$, $CO_2O_3$, NiO, $ZnTiO_4$, and a combination of these elements.

Such second materials may be used in the device in order to measure temperature for all types of applications.

The second material may comprise a material whose conductivity increases as the value of the measurand increases.

The second material may comprise a material whose conductivity decreases as the value of the measurand increases.

The second pattern may have an impedance whose real part and imaginary part each change in opposite ways. For example, the real part of the impedance of the second pattern may decrease while the imaginary part may increase and vice versa.

According to one embodiment, the assembly formed by the first pattern and the second pattern of the device is essentially two-dimensional. Such a device has a generally planar arrangement. As presented later on, the first pattern and the second pattern may in particular form two spirals that extend mainly in the plane and are nested one inside the other.

According to another embodiment, the assembly formed by the first pattern and the second pattern of the device is essentially three-dimensional. Such a device has a generally volumetric arrangement.

In particular, the second pattern takes the form of a hollow cylinder defining an outer surface and an inner surface, the first pattern being wrapped around and/or inside the second pattern such that the first pattern is in contact with the outer surface of the second pattern and/or the inner surface of the second pattern and/or is at least partially in the thickness of the second pattern.

The first pattern may be configured to form a hollow cylinder of a first conductive material and the second pattern may be configured to form a strip or wire in contact with the hollow cylinder. The second pattern may, for example, be wrapped helically around and/or inside the first pattern such that the first pattern is in contact with the outer surface of the first pattern and/or the inner surface of the first pattern and/or is at least partially in the thickness of the first pattern. The hollow cylinder may then be designed to allow the passage of a gas, liquid or solid or a mixture thereof.

Similarly, the second pattern may be configured to form a hollow cylinder of a second material and the first pattern may be configured to form a strip or wire in contact with the hollow cylinder. The first pattern may be wrapped helically around and/or inside the second pattern such that the first pattern is in contact with the outer surface of the second pattern and/or the inner surface of the second pattern and/or is at least partially in the thickness of the second pattern. The hollow cylinder may then be designed to allow the passage of a gas, liquid or solid or a mixture thereof.

The first and second patterns may also be arranged in the form of two nested helices so as to constitute a hollow cylinder.

What is meant by "cylinder" is any surface whose straight generatrices are parallel and not only right circular cylinders.

Advantageously, the first pattern takes the form of a spiral with n turns or exhibits meanders.

Advantageously, the second pattern takes the form of a spiral with m turns with $m \leq n$, or exhibits meanders.

n corresponds to a decimal number strictly greater than 1.

These spiral-shaped or meandering patterns may be designed in an essentially two-dimensional embodiment as well as in an essentially three-dimensional embodiment.

The term "spiral" should be understood in the common sense, such that a spiral pattern is a winding pattern. The winding shape may be circular, square, rectangular, hexagonal. Other shapes are possible in order to adapt the device to its end use.

The spiral may consist of coaxial and/or coplanar turns. In particular and in an essentially two-dimensional embodiment, the turns of the first pattern and/or of the second pattern are preferably arranged planarly. In particular and in an essentially three-dimensional embodiment, the turns of the first pattern and/or of the second pattern are preferably arranged coaxially.

What is meant by "meandering" is a sinuous curve consisting of a plurality of consecutive loops whose curvatures are alternately clockwise and counterclockwise (or vice versa).

When the patterns are in the form of a spiral, they may form a self-inductor. What is meant by "self-inductor" is an induction coil, i.e. a component formed of multiple turns, in which a magnetic field is induced by the current flowing through the turns.

The second pattern is in electrical contact with the first pattern in such a way that if the first pattern is arranged in the form of a spiral, the second pattern is arranged between the consecutive turns of the first pattern so as to electrically connect these consecutive turns, i.e. in all or some of the inter-turn space.

In one particular case, in the case of a first pattern arranged in n spirals, the second pattern may comprise a first portion between the outermost turn and the second outermost turn and a second portion between the innermost turn and the second innermost turn.

The signal processing implemented may be more robust because the device may be inserted into a conditioning circuit whose signal frequency is the image of the measurand, whereas in the case of a resistive sensor it is the amplitude of the signal which contains the information relating to the measurand. This allows noise immunity to be greater* and/or the extraction of useful information from the noisy overall signal to be easier than when using a resistive sensor.

In addition, the device according to the invention may readily be placed in a wireless communication system which may transmit information contactlessly and be supplied with power remotely. Specifically, it is possible to combine the inductance variation sensor with an inductive element. There is then an inductive coupling between the inductance variation sensor and the inductive element if they are placed close enough to one another. The mutual inductance between the inductance variation sensor and the inductive element then follows the variations in inductance of the inductance variation sensor. Information is transferred (the variation in inductance being the image of the measurand) from the inductance variation sensor to the inductive element without them being in contact. This is possible by virtue of the magnetic field that is created in an inductor when a current flows through it according to the Biot-Savart law and Ampere's circuital law. Similarly, energy transfer from the inductive element to the inductance variation sensor is possible via magnetic coupling. If this energy transfer is sufficient, it is possible for the inductance variation sensor to be supplied with power by the inductive element contactlessly, i.e. supplied with power remotely. These principles of information transfer or remote power supply via magnetic field are used in systems such as RFID (radio-frequency identification) or contactless technologies such as NFC (near-field communication).

Advantageously, the device according to the invention comprises a substrate forming a support for the first pattern and the second pattern. What is meant by "substrate" is a material on the surface of which is arranged a circuit comprising the first pattern and the second pattern. The substrate may be an insulating or passivated substrate. What is meant by "insulating" is that the substrate comprises a material that does not allow the passage of an electric current.

Advantageously, the first pattern and the second pattern are arranged fixedly on the substrate, that is to say that they are not movable with respect to one another.

Preferably, the substrate is composed of a material selected from a group of materials comprising silicon, epoxy, ceramics, glass, paper, plastics, elastomers, and a combination of these elements.

Advantageously, the measurand is a gas or a gas concentration, a humidity or a moisture content, a vapor, a volatile organic compound (VOC) or a concentration of a VOC, a force or pressure, a temperature, visible, infrared or ultraviolet radiation, a molecule of interest or a concentration of a molecule of interest.

Advantageously, the means for determining the impedance or the inductance comprises an impedance meter, an inductance meter or a network vector analyzer.

Even more advantageously, the device comprises at least a third pattern in electrical contact at least with the first pattern, the third pattern being made of a third material and having a third impedance that changes continuously as a function of a second measurand.

The device according to the invention may operate dynamically or statically. What is meant by "operate dynamically" is that the device according to the invention requires a differential measurement between a first value of the measurand and a second value of the measurand. What is meant by "operate statically" is that the device according to the invention makes it possible to determine a measurand with a single measurement. Calibration of the device is preferable beforehand prior to use of the device in static operation.

In the case of a device operating dynamically, the difference in impedance or inductance measured between a time $t_0$ when the measurand, for example a gas, is at a concentration $x_0$ and a time $t_1$ when the measurand is at a concentration $x_1$ different from $x_0$ makes it possible to determine a change in the measurand.

In the case of a device operating statically, an impedance measured at a time $t_0$ makes it possible to determine the measurand, for example the presence or absence of a gas and/or its concentration via the measured impedance or inductance.

Advantageously, the means for determining the impedance or inductance comprises an inductance meter.

DETAILED DESCRIPTION

Figure 1:
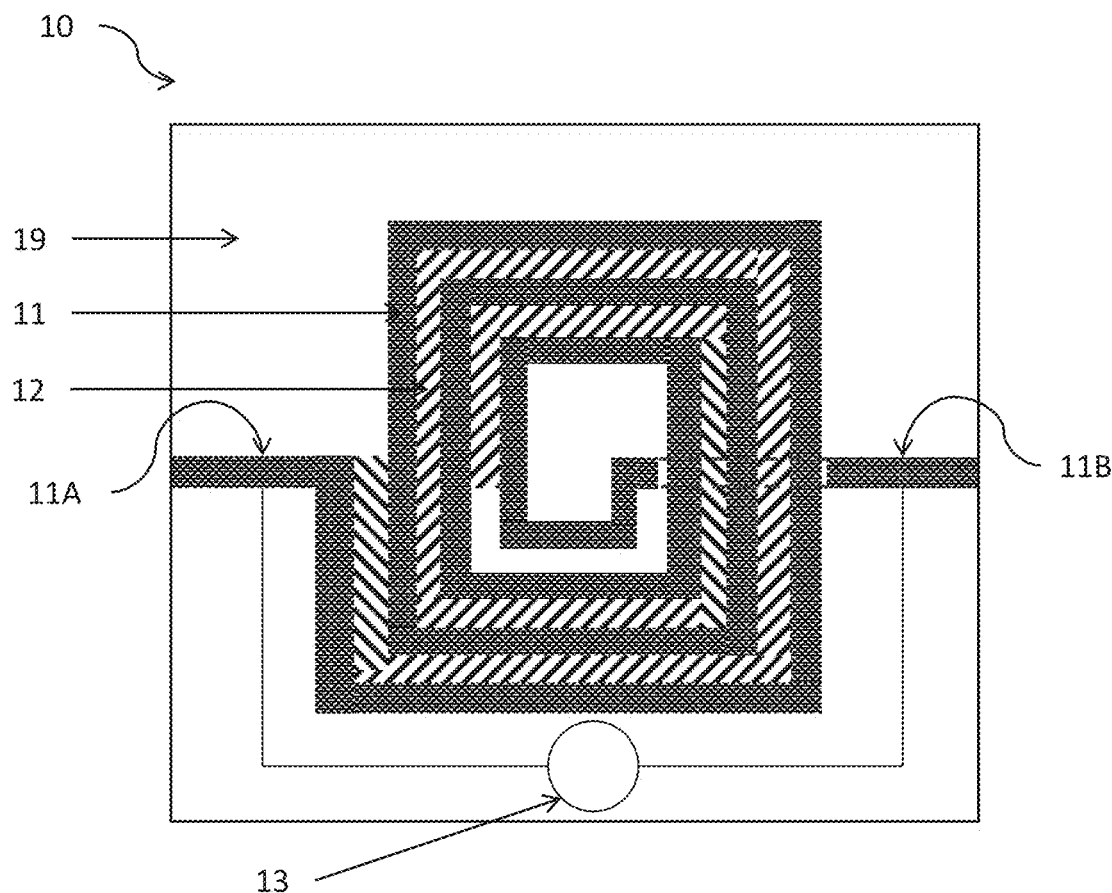
FIG. 1 illustrates a first variant of a first embodiment of the invention comprising a first pattern arranged in the form of a square spiral with 3.5 turns and a second pattern in electrical contact with substantially all of the first pattern.

Numerous variants of the various embodiments presented in this description are possible. The shape of the first pattern and that of the second pattern is to be adapted according to the environment in which the device is located and according to the measurand that the device aims to determine. Preferably, the first pattern and the second pattern are organized so that the physical distance to be traversed by a current between a first point of electrical contact between the first pattern and the second pattern and a second point of electrical contact between the first pattern and the second pattern is shorter via the second pattern only than via the first pattern only.

According to a first embodiment, the assembly formed by the first pattern and the second pattern of the device is essentially two-dimensional, that is to say that the height of the device is minimal with respect to the length or the width of the device, the height of the device corresponding to the thickness of the first pattern. Such a device may in particular have the planar general arrangement corresponding to the variant embodiments shown in FIGS. 1 to 7. In such a device, the second pattern preferably at least circumscribes the first pattern, that is to say is at least arranged in the plane delimited by the first pattern. The plane delimited by the first pattern of the device essentially in two dimensions corresponds to a plane of the same length and width as the first pattern.

According to a second embodiment, the assembly formed by the first pattern and the second pattern of the device is three-dimensional. In such a device, the second pattern preferably at least circumscribes the first pattern, that is to say is at least arranged in the volume delimited by the first pattern. The volume delimited by a first pattern in three dimensions corresponds to a volume of the same height, length and width as the first pattern.

According to one embodiment particular to the three-dimensional mode, the assembly formed by the first pattern and the second pattern of the device forms a cylinder. Such a device is particularly shown in FIGS. 8 and 9. In such a device, the second pattern preferably at least circumscribes the first pattern, that is to say is at least arranged in the volume delimited by the first pattern. For example, the volume delimited by the first pattern of FIG. 8 or FIG. 9, the first pattern forming a winding, corresponds to a volume of the same outer radius as the winding and of the same length as this winding, the second pattern at least circumscribing the first pattern, that is to say at least arranged in the volume delimited by the first pattern.

The value of a square spiral planar inductor or self-inductor as illustrated may be estimated analytically based on the following formula under certain conditions of validity specified in the publication "Simple accurate expressions for planar spiral inductance", S. S. Mohan, M. M. Hershenson, S. P. Boyd, T. H. Lee, IEEE Journal of Solid-State Circuits, Vol. 34, No 10, October 1999, pp. 1419-1424.

$$L = 2.34\mu_0 \frac{n^2 d_{avg}}{1 + 2.75\rho} \text{ with } d_{avg} = \frac{d_{out} + d_{in}}{2} \text{ and } \rho = \frac{d_{out} - d_{in}}{d_{out} + d_{in}} \quad [\text{Math 1}]$$

And where $\mu_0$ is the permeability of vacuum, n the number of turns of the spiral, $d_{in}$ the inner diameter and $d_{out}$ the outer diameter of the inductor.

The value of the inductance L is thus proportional to the square of the number of turns of the spiral.

Considering a first pattern in the form of a spiral with ten turns whose nominal inductance value is $L_0$ and considering a second pattern in the form of a spiral with one turn and arranged in electrical contact with the two outermost consecutive turns of the first pattern, then the assembly formed by the first pattern and the second pattern has approximately 9 turns when the measurand is such that the second pattern is electrically conductive. In this model, it is considered that the second pattern becomes electrically conductive in a manner equivalent to the first pattern. The value of the inductance is therefore reduced by a factor 100/81 and the inductance is then $L_0/(100/81)$.

Considering a first pattern in the form of a spiral with ten turns whose nominal inductance value is $L_0$ and considering a second pattern arranged in the form of a spiral with two turns in electrical contact with the outermost consecutive turns of the first pattern, then the assembly formed by the first pattern and the second pattern has approximately 8 turns when the measurand is such that the second pattern is electrically conductive. In this model, it is considered that the second pattern becomes electrically conductive in a manner equivalent to the first pattern. The value of the inductance is therefore reduced by a factor 100/64 and the inductance is $L_0/(100/64)$.

FIG. 1 illustrates a first variant of the device 10 which corresponds to the first embodiment. The device comprises a first pattern 11 made of a first conductive material and a second pattern 12 made of a second material whose conductivity is sensitive to the measurand. The first pattern and the second pattern are arranged on a substrate 19.

The first pattern 11 comprises a first end 11A and a second end 11B. According to the first variant of the first embodiment, the device 10 also comprises a determination means 13 configured to measure the impedance or the inductance between the first end 11A and the second end 11B of the first pattern 11.

The first pattern 11 is configured in a spiral with 3.5 turns and forms a self-inductor. The second pattern 12 is in electrical contact with the first pattern 11. The second pattern 12 is arranged between the turns of the first pattern 11 in such a way that the turns formed by the first pattern 11 are intimately and electrically connected together by the second pattern 12. What is meant by "connected" is that the second pattern 12 forms at least one connection between two consecutive turns of the first pattern 11.

According to this first variant, the second pattern 12 is in electrical contact with the consecutive coplanar turns of the first pattern 11, such that the second pattern forms two coplanar turns.

Figure 2A:
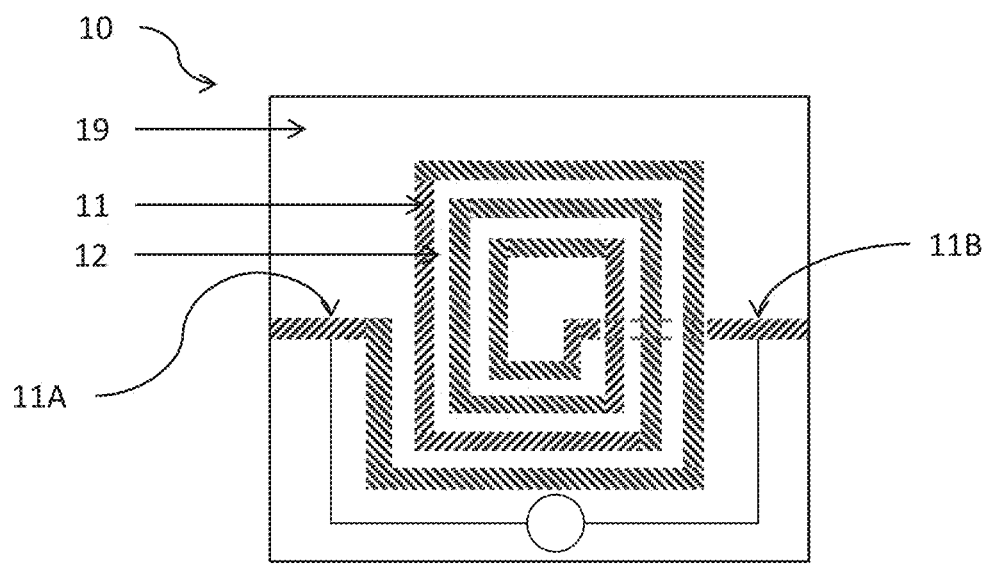
FIG. 2A illustrates the conductive portion of the circuit of the device according to the first variant of a first embodiment of the invention when the second material is not electrically conductive.

The hatched portion of FIG. 2A illustrates the conductive portion of the circuit of the device 10 according to this first variant when the second material is not electrically conductive. When the second pattern 12 is not electrically conductive, the current flows according to the geometric shape of the first pattern 11.

Figure 2B:
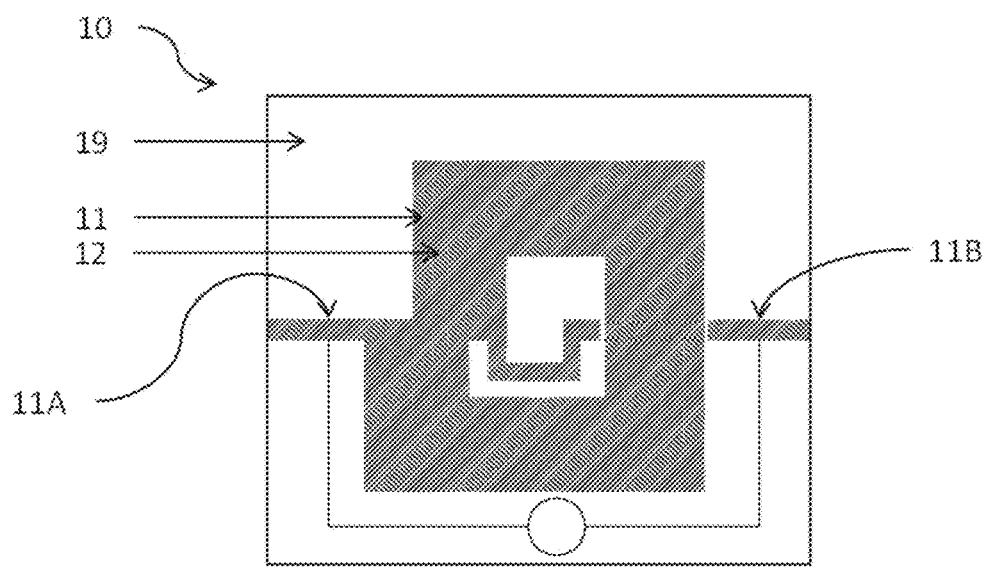
FIG. 2B illustrates the conductive portion of the circuit of the device according to the first variant of a first embodiment of the invention when the second material is electrically conductive.

The hatched portion of FIG. 2B illustrates the conductive portion of the circuit of the device 10 according to this first variant when the second material is electrically conductive. When the second pattern 12 is electrically conductive, the current flows according to the geometric shape of the first pattern 11 and of the second pattern 12.

The impedance of the second pattern 12 changes continuously as a function of the measurand. Thus, the impedance of the assembly formed by the first pattern and the second pattern, measured between the first end 11A and the second end 11B, changes continuously as a function of the impedance of the first pattern 11 and of the second pattern 12. When the first pattern 11 is made of a conductive material that is substantially insensitive to variation in the measurand, that is to say that its impedance varies substantially little as a function of the measurand, then the impedance measured between the first end 11A and the second end 11B essentially varies as a function of the impedance of the second pattern 12. Thus, the impedance or the inductance measured between the first end 11A and the second end 11B changes as a function of the variation in the measurand.

Figure 3:
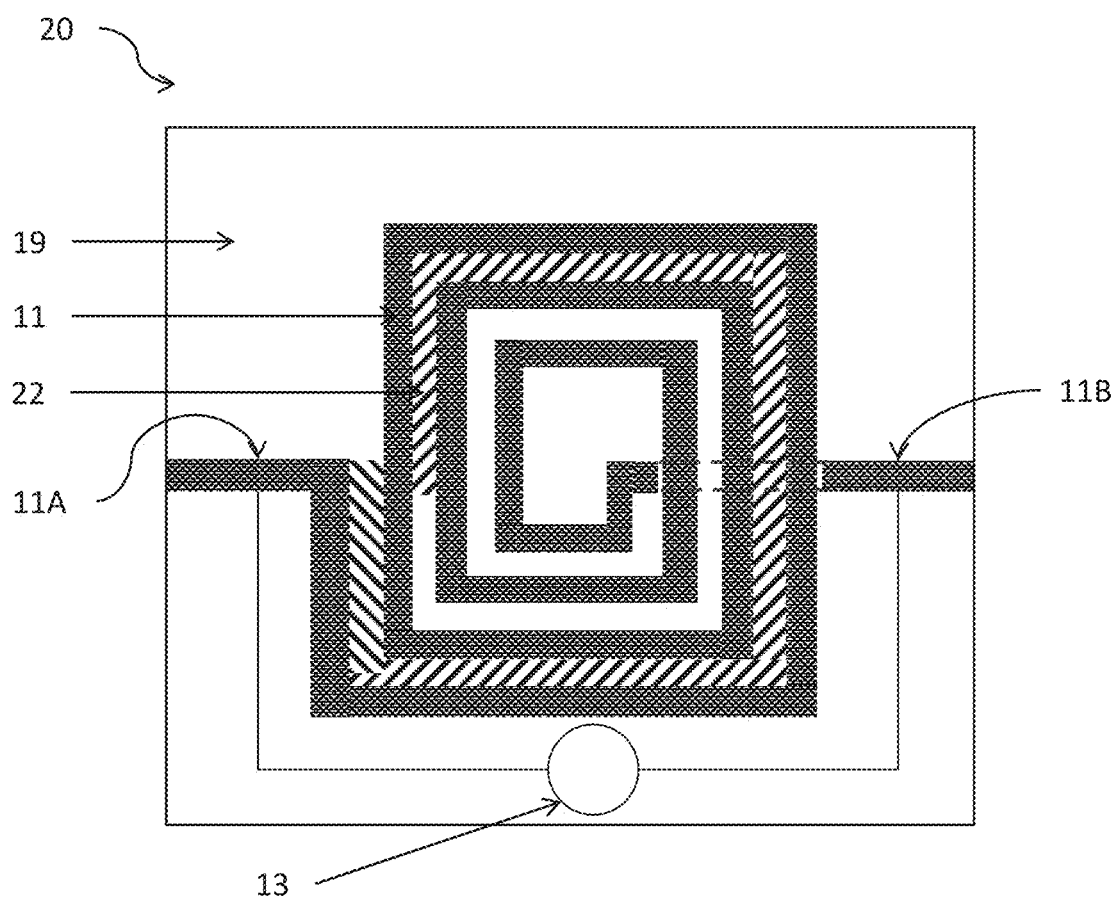
FIG. 3 illustrates a second variant of a first embodiment of the invention comprising a first pattern arranged in the form of a square spiral with 3.5 turns and a second pattern in electrical contact with the first pattern over only some of the first pattern.

FIG. 3 illustrates a second variant of the device 20 which corresponds to the first embodiment. The device 20 comprises a first pattern 11 having a first impedance and a first end 11A and a second end 11B. The first pattern 11 is arranged in the form of a square spiral with 3.5 turns and a second pattern 22 is in electrical contact with the first pattern 11 along part of the first pattern 11 which corresponds to the outermost turn of the first pattern and the second outermost turn of the first pattern. The second pattern 22 is thus arranged in the form of a square spiral with one turn between the two outermost consecutive turns of the first pattern 11 and allows these two consecutive turns to be joined via the second pattern.

According to this second variant, the device 20 comprises a means 13 for determining the impedance or the inductance which is arranged between a first end 11A and a second end 11B of the first pattern 11. The determination means makes it possible to measure the value of the impedance exhibited by the assembly formed by the first pattern 11 and the second pattern 22.

Figure 4A:
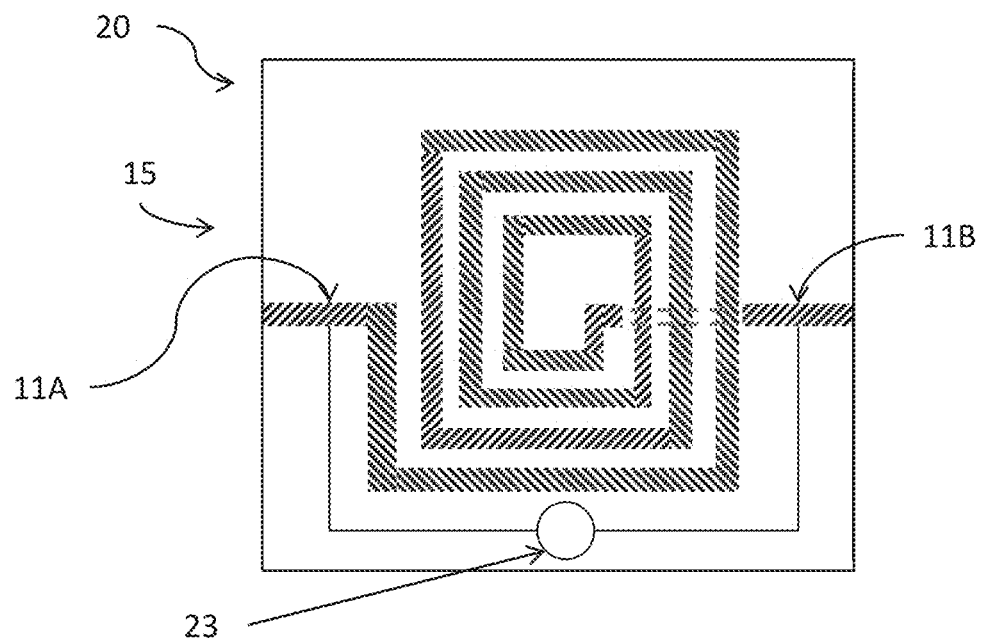
FIG. 4A illustrates the conductive portion of the circuit of the device according to the second variant of a first embodiment of the invention when the second material is not electrically conductive.

FIG. 4A illustrates the conductive portion of the circuit of the device 20 according to this second variant when the second material is not conductive. When the second pattern 22 is not electrically conductive, the current flows according to the geometric shape of the first pattern 11, that is to say according to the spiral consisting of 3.5 consecutive turns of the first pattern 11. A generated impedance or inductance may be measured between the first end 11A and the second end 11B.

Figure 4B:
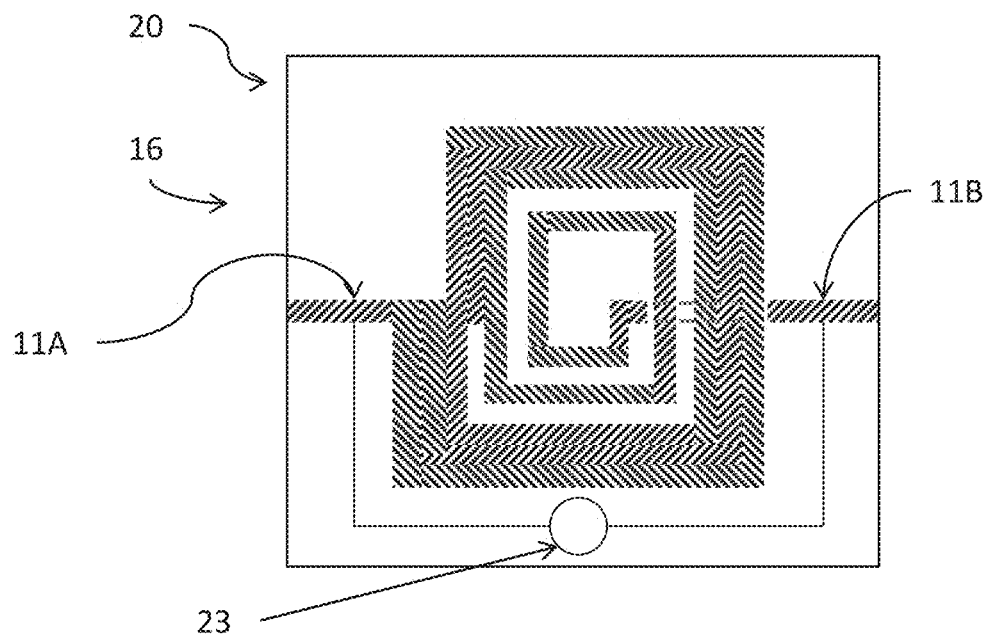
FIG. 4B illustrates the conductive portion of the circuit of the device according to the second variant of a first embodiment of the invention when the second material is electrically conductive.

FIG. 4B illustrates the conductive portion of the circuit of the device 20 according to this second variant 20 when the second material is electrically conductive. When the second pattern 22 is electrically conductive, the current flows according to the geometric shape of the first pattern 11 and of the second pattern 22.

Figure 5:
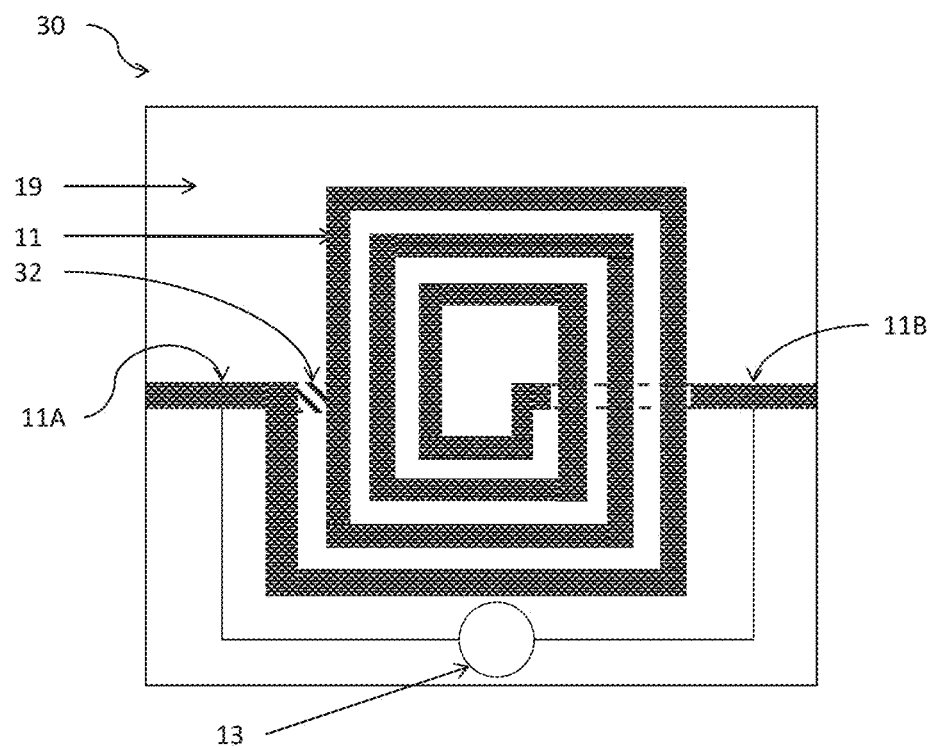
FIG. 5 illustrates a third variant of a first embodiment of the invention comprising a first pattern arranged in the form of a square spiral with 3.5 turns and a second pattern in electrical contact with the first pattern over a very small part of the first pattern.

FIG. 5 illustrates a third variant of the device 30 corresponding to the first embodiment. The device 30 comprises a first pattern 11 arranged in the form of a square spiral with 3.5 turns and a second pattern 32 in electrical contact with the first pattern 11, the second pattern being arranged between the outermost turn and the second outermost turn of the first pattern 11.

Figure 6:
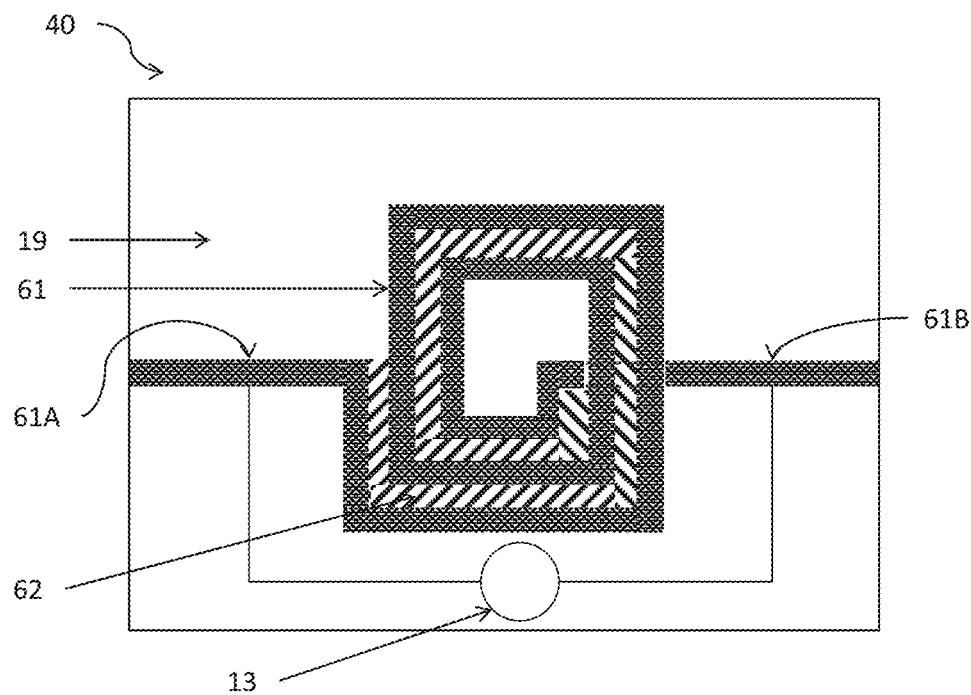
FIG. 6 illustrates a fourth variant of a first embodiment of the invention comprising a first pattern arranged in the form of a square spiral with 2.5 turns and a second pattern in electrical contact with all of the first pattern.

FIG. 6 illustrates a fourth variant of the device 40 corresponding to the first embodiment of the invention. The device 40 comprises a first pattern 61 arranged in the shape of a square spiral with 2.5 turns, the first pattern having a first end 61A and a second end 61B at a distance from the first end, and a second pattern 62 in electrical contact with the first pattern 61 and arranged in the shape of a square spiral with 1.5 turns.

Figure 7:
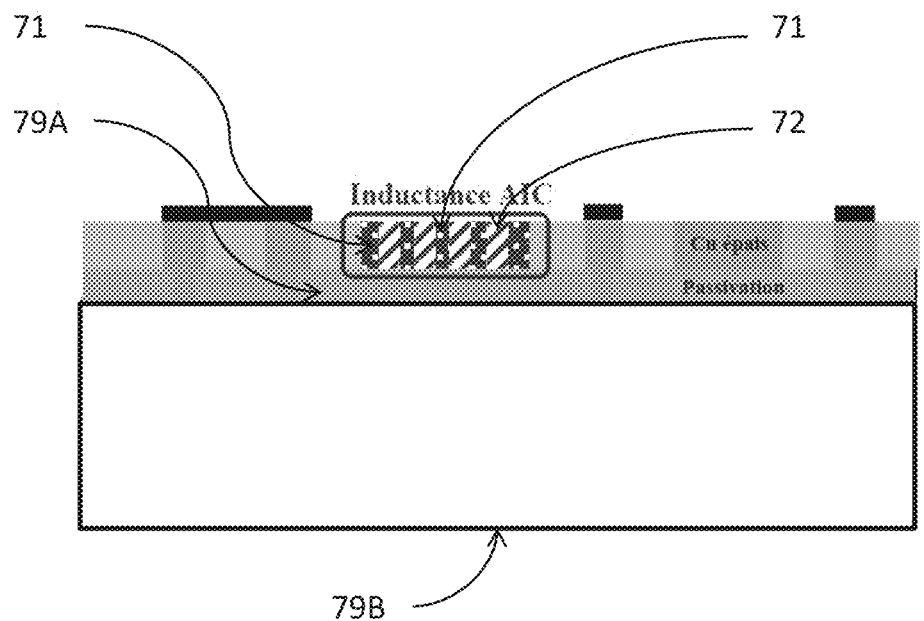
FIG. 7 illustrates a cross-sectional view of an example of integrating the device of the invention into a CMOS technology.

FIG. 7 illustrates a cross-sectional view of an example of integrating the device into a CMOS (complementary metal-oxide-semiconductor) technology. The device according to the invention is above-IC (integrated circuit)-integrated, that is to say integrated above a passivation layer 79A and a silicon substrate 79B. In the case of application to a sensor capable of determining a measurand in the air, for example determining the presence or absence of a gas or a volatile organic compound present in the air or determining the concentration of a gas or of a volatile organic compound present in the air, the device according to the invention may be integrated above the passivation layer 79A so that the device may be in contact with the air and therefore, for example, in contact with a gas or a volatile organic compound present in the air.

In this exemplary integration of the device illustrated by FIG. 7, the first pattern 71 is a spiral inductor formed above a passivation layer 79A. The second pattern 72 is arranged between the turns of the spiral inductor of the first pattern 71 and is in electrical contact therewith. The spiral inductor of the first pattern 71 may be square, hexagonal, octagonal or circular. Similarly, the second pattern 72 may be similar in shape to the first pattern.

Another variant of the device according to the invention (not illustrated) may be produced with first and second patterns in the form of circular spirals. These patterns may be produced using technologies for printing onto flexible or even stretchable supports, typically by screen printing or inkjet printing, for example using silver ink. According to this variant, the device comprises an insulating substrate on which the patterns rest having low relative permittivities $\varepsilon_r$, in particular lower than 5, and thicknesses ranging from a few micrometers to several hundred micrometers. The insulating substrate is, for example, made of paper, plastic or elastomer. The second pattern comprises a second material sensitive to a pressure or to a mechanical stress and whose resistivity changes as a function of the applied force (pressure or stress). For example, piezoresistive materials and in particular semiconductors may be used. Such a device could be used as a force or pressure sensor.

Such a device may be advantageously used to produce a sensor for gases, vapors or VOCs, for which the reactions take place at the surface rather than in the volume, and for which large areas of silicon are not suitable because they are expensive, stiff and heavy. Such a device comprising patterns on a flexible support is flexible, conformable and lightweight in addition to being inexpensive.

Figure 8:
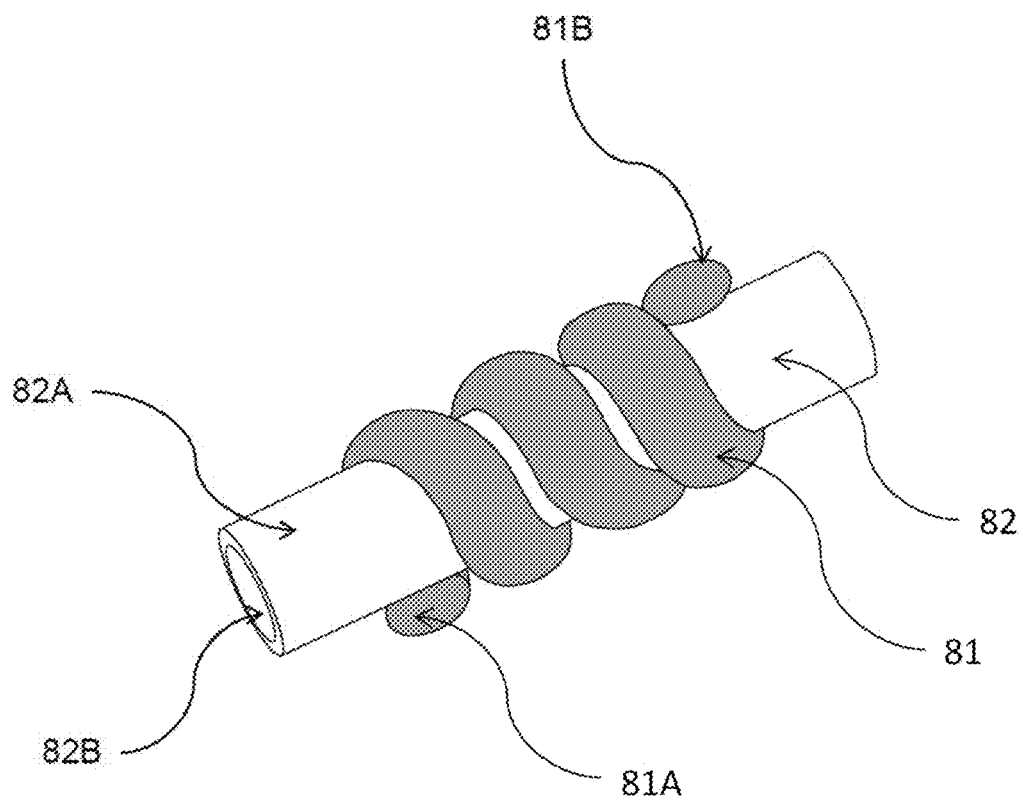
FIG. 8 illustrates a first variant of a second embodiment of the invention comprising a first pattern corresponding to a winding around a second pattern in the form of a hollow right circular cylinder.

FIG. 8 illustrates a three-dimensional view of a first variant of a second embodiment comprising a first pattern 81 having a first end 81A and a second end 81B and corresponding to a winding or coil around a second pattern 82 in the form of a hollow right circular cylinder, the second pattern defining an outer surface 82A and an inner surface 82B. The second pattern defines an inner space that allows the passage of a liquid, gas or solid or a mixture thereof from one end of the second pattern to an opposite end of the second pattern. This first variant of a second embodiment also comprises means (not shown) for determining the impedance or the inductance of the assembly formed by the first pattern and the second pattern.

For example, a liquid may pass through the inner space of the second pattern, from a first end to an opposite end. In the case of a measurand being the concentration of a specific gas in the liquid, the impedance of the second pattern will change continuously as a function of the concentration of this specific gas when it comes into contact with the second pattern. The impedance or inductance of the assembly formed by the first pattern and the second pattern therefore changes continuously as a function of the measurand. The device makes it possible, for example, to monitor contamination of a liquid by a gas inside the hollow cylinder.

According to this first variant of a second embodiment, the first pattern is arranged in such a way that a liquid, solid or gas passing from a first end of the second pattern to an opposite end of the second pattern comes into contact with the second pattern but does not come into contact with the first pattern.

Numerous variants of the second embodiment are possible and it may be adapted according to the environment and the measurand. The device may be designed so that the first pattern may be in contact with the solid, liquid or gas passing from one end of the second pattern to an opposite end of the second pattern.

Figure 9:
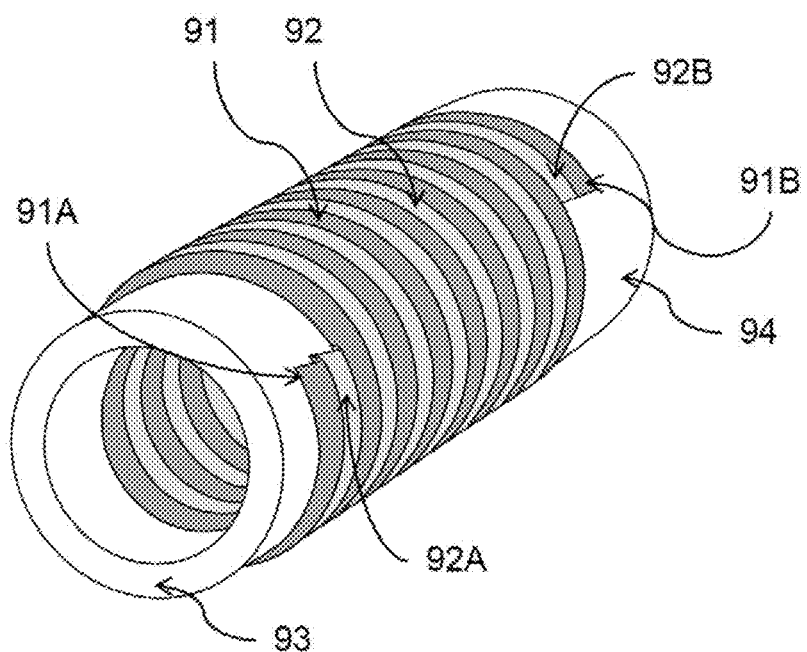
FIG. 9 illustrates a second variant of a second embodiment of the invention comprising a first pattern corresponding to a first winding and a second pattern corresponding to a second winding, the assembly formed by the first and second patterns being a hollow right circular cylinder.

FIG. 9 illustrates a three-dimensional view of a second variant of the second embodiment comprising a first pattern 91 having a first end 91A and a second end 91B and a second pattern 92 having a first end 92A and a second end 92B. The assembly formed by the first pattern and the second pattern corresponds to a cylinder allowing a first cylinder 93 to be connected to a second cylinder 94. This second variant of a second embodiment also comprises means (not shown) for determining the impedance or the inductance of the assembly formed by the first pattern and the second pattern.

According to this second variant of a second embodiment, the first pattern and the second pattern are arranged in such a way that a liquid, solid or gas passing from a first end of the first pattern to an opposite end of the first pattern comes into contact with the first pattern and the second pattern.

Numerous other variants of the second embodiment are possible and those skilled in the art will know how to adapt the shape of the assembly formed by the first pattern and the second pattern and the arrangement of the first pattern and of the second pattern according to the measurand and/or the environment in which the device is used.

The invention claimed is:

1. A device for determining a measurand, comprising:
a first pattern made of a first conductive material, the first pattern having a first impedance and having a first end and a second end at a distance from the first end,
a second pattern at least arranged between the first end and the second end of the first pattern and circumscribing the first pattern, the second pattern being in electrical contact with the first pattern, being made of a second material and having a second impedance that changes continuously as a function of the measurand, such that the impedance or inductance of the assembly formed by the first pattern and the second pattern changes continuously as a function of the measurand,
a means for determining the impedance or the inductance of the assembly formed by the first pattern and the second pattern.

2. The device as claimed in claim 1, the first conductive material being insensitive or barely sensitive to the variation of the measurand.

3. The device as claimed in claim 1, the second material being a material having a conductivity that changes continuously as a function of the measurand.

4. The device as claimed in claim 3, the second material being a material whose conductivity increases when the value of the measurand increases.

5. The device as claimed in claim 3, the second material being a material whose conductivity decreases when the value of the measurand increases.

6. The device as claimed in claim 1, the assembly formed by the first pattern and the second pattern being essentially two-dimensional.

7. The device as claimed in claim 1, the assembly formed by the first pattern and the second pattern being essentially three-dimensional.

8. The device as claimed in claim 7, the second pattern taking the form of a hollow cylinder defining an outer surface and an inner surface, the first pattern being wrapped around and/or inside the second pattern such that the first pattern is in contact with the outer surface of the second pattern and/or the inner surface of the second pattern and/or is at least partially in the thickness of the second pattern.

9. The device as claimed in claim 1, the first pattern taking the form of a spiral with n turns or exhibiting meanders.

10. The device as claimed in claim 9, the second pattern taking the form of a spiral with m turns with m n, or exhibiting meanders.

11. The device as claimed in claim 1, comprising a substrate forming a support for the first pattern and the second pattern.

12. The device as claimed in claim 1, the measurand being chosen from a list comprising: a gas or a gas concentration, a humidity or a moisture content, a vapor, a volatile organic compound (VOC) or a concentration of a VOC, a force or pressure, a temperature, visible, infrared or ultraviolet radiation, a molecule of interest or a concentration of a molecule of interest.

13. The device as claimed in claim 1, the means for determining the impedance or the inductance possibly comprising an impedance meter, an inductance meter or a vector network analyzer.

14. The device as claimed in claim 13, the means for determining the impedance or the inductance comprising an inductance meter.

* * * * *

UNITED STATES PATENT AND TRADEMARK OFFICE
CERTIFICATE OF CORRECTION

Page 1 of 1

PATENT NO. : 11,892,489 B2
APPLICATION NO. : 17/765426
DATED : February 6, 2024
INVENTOR(S) : Evangéline Benevent It is certified that error appears in the above-identified patent and that said Letters Patent is hereby corrected as shown below:

In the Claims

In Claim 10, Column 14, Line 40, "turns with m n, or exhibiting meanders." should be -- turns with $m \leq n$, or exhibiting meanders. --.

Signed and Sealed this
Twenty-third Day of April, 2024

Katherine Kelly Vidal
*Director of the United States Patent and Trademark Office*